United States Patent
Chen

(10) Patent No.: US 7,317,228 B2
(45) Date of Patent: Jan. 8, 2008

(54) OPTIMIZATION OF NMOS DRIVERS USING SELF-BALLASTING ESD PROTECTION TECHNIQUE IN FULLY SILICIDED CMOS PROCESS

(75) Inventor: Jau-Wen Chen, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 96 days.

(21) Appl. No.: 11/055,145

(22) Filed: Feb. 10, 2005

(65) Prior Publication Data

US 2006/0175665 A1    Aug. 10, 2006

(51) Int. Cl.
*H01L 23/62*    (2006.01)

(52) U.S. Cl. ................................. 257/360; 257/361

(58) Field of Classification Search ........ 257/355–358, 257/360, 361
See application file for complete search history.

(56) References Cited

U.S. PATENT DOCUMENTS 5,742,083 A *  4/1998  Lin ............................ 257/355
6,864,536 B2 *  3/2005  Lin et al. ..................... 257/355
2004/0164356 A1 *  8/2004  Mergens et al. ............ 257/360

OTHER PUBLICATIONS

Keppens, Bart et al., "Active-Area-Segmentation (AAS) Technique for Compact, ESD Robust, Fully Silicided NMOS Design", EOS/ESD Symposium, 2003.
Verhaege, Koen G. et al., "Novel Design of Driver and ESD Transistors with Significantly Reduced Silicon Area", Sarnoff and Sarnoff Europe, 2001.

* cited by examiner

*Primary Examiner*—Thien F Tran
(74) *Attorney, Agent, or Firm*—Trexler, Bushnell, Giangiorgi, & Blackstor Ltd.

(57) ABSTRACT

Design and optimization of NMOS drivers using a self-ballasting ESD protection technique in a fully silicided CMOS process. Silicided NMOS fingers which include segmented drain diffusion. Specifically, the segmented drain diffusion provides self-ballasting resistors which improves the ESD performance. Preferably, the width of the each diffusion resistor is relatively small, as this can improve a non-uniform silicidation process. The resistance of the segmented diffusion resistors is determined by their width and length, and effectively increases the ballasting effect of parasitic n-p-n bipolar transistors.

9 Claims, 5 Drawing Sheets

| Parameters | Optimization |
|---|---|
| Lcd | 2xmdr |
| Ldd | 1.6xmdr |
| DCGS | ≥ 2.0um |
| Wsb | ≥ 1.5xmdr |
| Lsb | DCGS-1.6xmdr-2xmdr |
| κ | 0.2 ~ 0.45 |

OPTIMIZATION OF NMOS DRIVERS USING SELF-BALLASTING ESD PROTECTION TECHNIQUE IN FULLY SILICIDED CMOS PROCESS

BACKGROUND

The present invention generally relates to NMOS drivers, and more specifically relates to a self-ballasting Electro Static Discharge (ESD) protection technique in a fully silicided CMOS process.

In CMOS technologies, non-silicided grounded-gate NMOS fingers (ggNMOSFET's) are widely used as the primary ESD device in I/O buffers and power rail clamps because of the high ballasting resistance effect. By designing drain-contact-to-gate spacing (DCGS), non-silicided NMOS fingers can provide very high ESD failure threshold.

In contrast, in fully silicided CMOS process (such as in LSI Logic's G10 technology), silicide block mask is not available, so an ESD robust design cannot be achieved because silicided NMOS fingers have very weak ESD failure threshold due to non-uniform trigger of parasitic N-P-N bipolar transistors. Although P/N junction diodes or silicon controlled rectifiers (SCR) can be used as the primary ESD device in output buffers, the ESD power clamp still becomes an issue. ESD weakness of silicided ggNMOS-FET's is mainly due to non-uniform silicidation process and low ballasting resistance.

FIG. 1 provides a top view of conventional silicided NMOS fingers 10. As shown, conventional NMOS fingers 10 generally includes a source 12, gates (or poly gates) 14, 16 and drains 18, 20. The source 12 includes source contacts 22, and the drains 18, 20 include drain contacts 24, 26, respectively. Proximate each of the drains 18, 20, generally between the drain contacts 24, 26 and the gates 14, 16 is non-segmented drain diffusion 30, 32. In other words, non-segmented drain diffusion 30 extends generally outwardly from drain 18 toward gate 14, and non-segmented drain diffusion 32 extends outwardly from drain 20 toward gate 16. Similarly, proximate the source 12, generally between the source contacts 22 and the gates 14, 16, is source diffusion 34.

As discussed above, conventional silicided ggNMOS-FET's, such as is shown in FIG. 1, have weak ESD protection, mainly due to non-uniform silicidation process and low ballasting resistance.

OBJECTS AND SUMMARY

A general object of an embodiment of the present invention is to improve the ESD performance of silicided NMOS fingers.

An object of an embodiment of the present invention is to provide a silicided NMOS finger which provides a self-ballasting resistence effect.

Another object of an embodiment of the present invention is to provide a silicided NMOS finger which optimizes the self-ballasting resistance effect.

A further object of the present invention is to provide a silicided NMOS finger which controls the effect of a non-uniform silicidation process, by using ballasting resistors.

Briefly, and in accordance with at least one of the foregoing objects, an embodiment of the present invention provides silicided NMOS fingers having gates, a source between the gates, drains, and at least one segmented drain diffusion proximate at least one of the drains, disposed generally between the at least one drain and at least one of the gates. More specifically, preferably there is a segmented drain diffusion proximate each of the drains, disposed generally between the drains and the gates.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION

Figure 1:
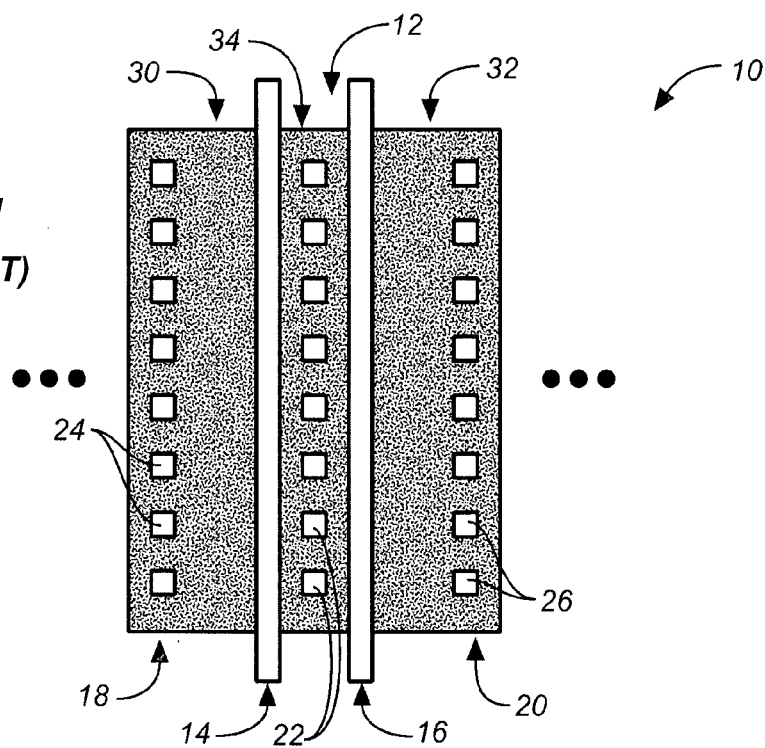
FIG. 1 is a top view illustrating conventional silicided NMOS fingers.

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

FIGS. 2-5 provide views of NMOS fingers which are in accordance with embodiments of the present invention. Each design includes segmented drain diffusion which provides a self-ballasting resistence effect, resulting in improved ESD performance.

Figure 2:
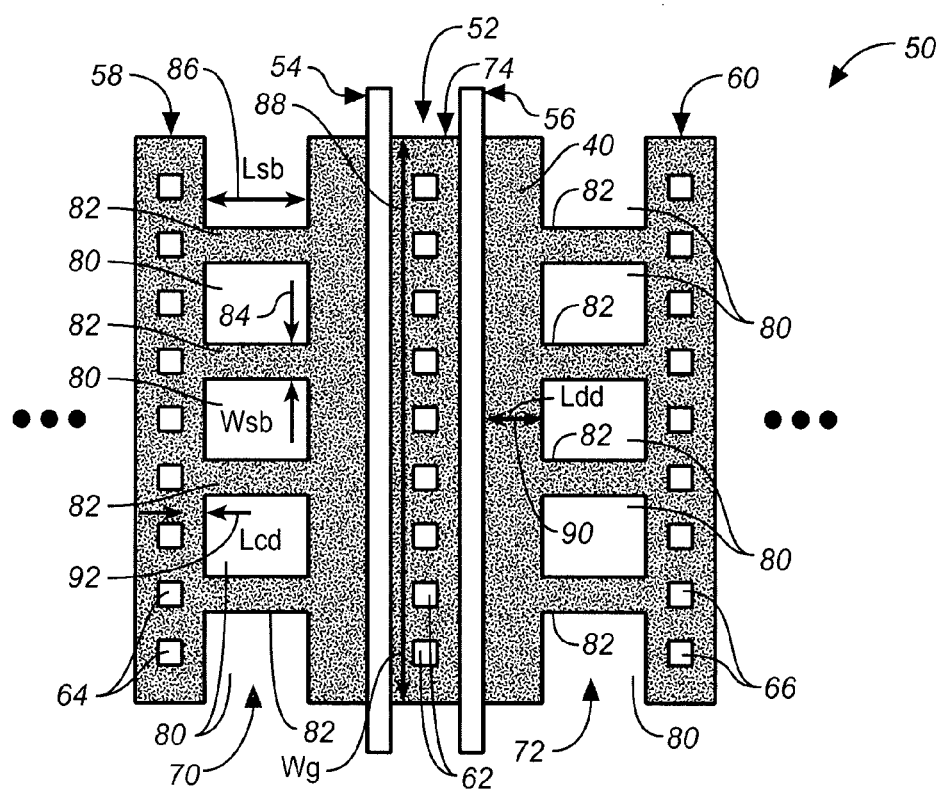
FIG. 2 is a top view of NMOS fingers where the design is in accordance with a specific embodiment of the present invention, wherein self-ballasting resistors face drain contacts.

FIG. 2 provides a top view of NMOS fingers 50 having a design which is in accordance with an embodiment of the present invention. As shown, the design includes a source 52, gates (or poly gates) 54, 56 and drains 58, 60. The source 52 includes source contacts 62, and the drains 58, 60 include drain contacts 64, 66, respectively. Proximate each of the drains 58, 60, generally between the drain contacts 64, 66 and the gates 54, 56, is segmented drain diffusion 70, 72. In other words, segmented drain diffusion 70 extends generally outwardly from drain 58 toward gate 54, and segmented drain diffusion 72 extends outwardly from drain 60 toward gate 56. Similarly, proximate the source 52, generally between the source contacts 62 and the gates 54, 56, is source diffusion 74. Preferably, the source diffusion 74 is non-segmented.

Figure 3:
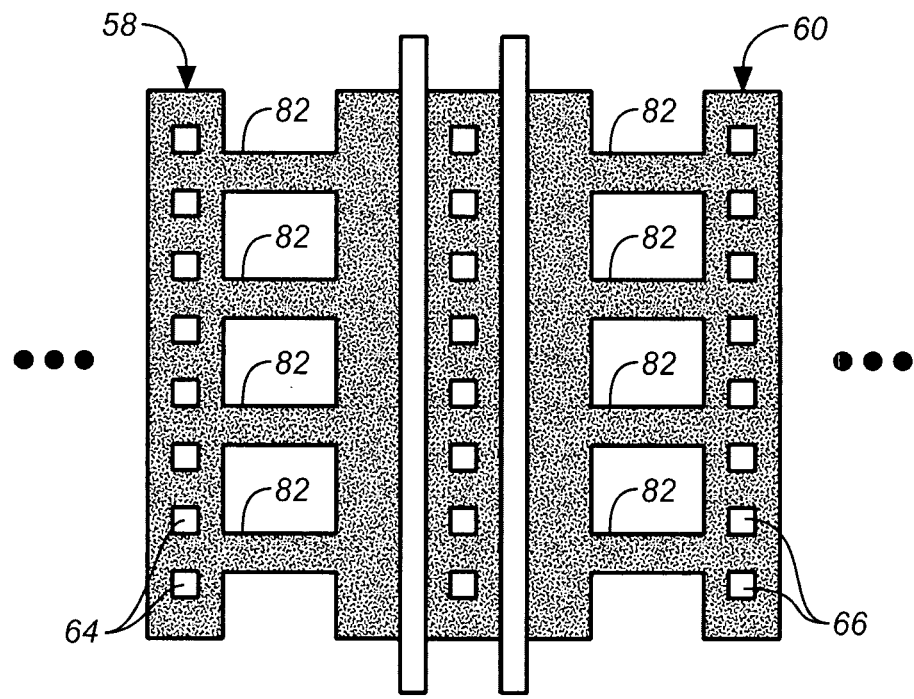
FIG. 3 is a top view of NMOS fingers where the design is in accordance with another specific embodiment of the present invention, wherein each self-ballasting resistor is disposed between two drain contacts.

Each drain diffusion 70, 72 includes openings 80 which are disposed between diffusion or self-ballasting resistors 82. Thus, each drain diffusion 70, 72 is "segmented" between its respective gate 54, 56 and drain contacts 64, 66. However, as shown in FIGS. 2 and 3, preferably the drain contacts 64, 66 are not separated by segmented diffusions.

Preferably, the drain diffusion resistors 82 are uniform relative to each other. In FIG. 2, the width 84 of the drain diffusion resistors 82 is identified as "Wsb," and the length 86 is identified as "Lsb." Furthermore, in FIG. 2, the width 88 of the channel or gate 54, 56 is identified as "Wg," the drain diffusion overlap 90 of gate 56 is identified as "Ldd" (with the other gate 54 being preferably similar), and the drain diffusion overlap 92 of the drain contacts 64 is identified as "Lcd" (with the overlap of the drain contacts 66 of the other drain 60 being preferably similar).

Preferably, the width 84, Wsb, of the each diffusion resistor 82 is relatively small, as this can improve a non-uniform silicidation process. The resistance of the segmented diffusion resistors 82 is determined by Wsb (84) and Lsb (86) and effectively increases the ballasting effect of parasitic n-p-n bipolar transistors. As discussed above, preferably the drain diffusion resistors 82 are uniform (i.e., each has the same width 84 (Wsb) and length 86 (Lsb). Additionally, preferably the layout with respect to the self-ballasting resistors 82 is such that Ldd (90) and Lcd (92) are symmetrical, as this tends to provide for more unfirm current disbursement and tends to reduce a current crowding effect which may otherwise result due to diffusion segmentation.

A segmented diffusion width ratio (k) in each finger can be defined as $$\kappa \equiv \frac{N \times Wsb}{Wg}$$

where N is the number of segmented diffusion resistors 82 in each NMOS finger (in both FIGS. 2 and 3, N=4), Wsb is the width 82 of each segmented diffusion resistor, and Wg is the channel width 88. While k<1 for NMOS finger designs having segmented drain diffusion such as is shown in FIGS. 2 and 3, k=1.0 for conventional silicided NMOS fingers, i.e., NMOS fingers without segmentation as shown in FIG. 1. More specifically, preferably k<0.5 in connection with the present invention, as this limits the ESD current flowing on the silicon surface.

While FIG. 2 shows an embodiment where each self-ballasting resistor 82 is generally aligned with a drain contact 64, 66, FIG. 3 illustrates an alternative embodiment wherein each self-ballasting resistor 82 is disposed between two drain contacts (i.e., between two drain contacts 64 of drain 58, or between two drain contacts 66 of drain 60).

Figure 4:
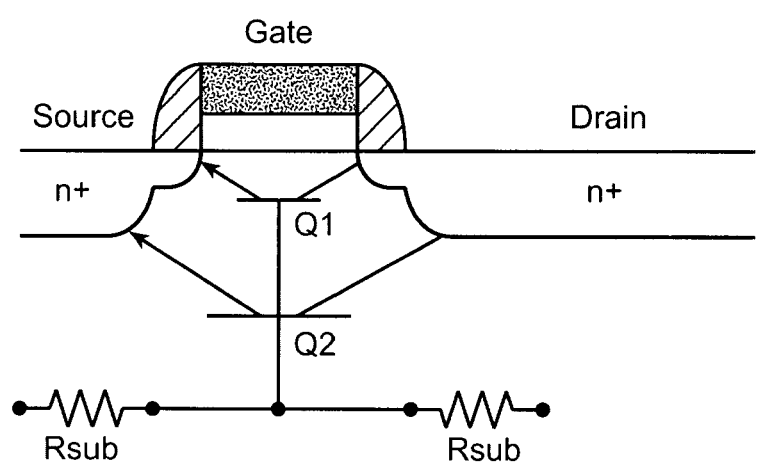
FIG. 4 is a cross-sectional view of the segmented drain diffusion region of two-bipolar NMOS fingers.
Figure 5:
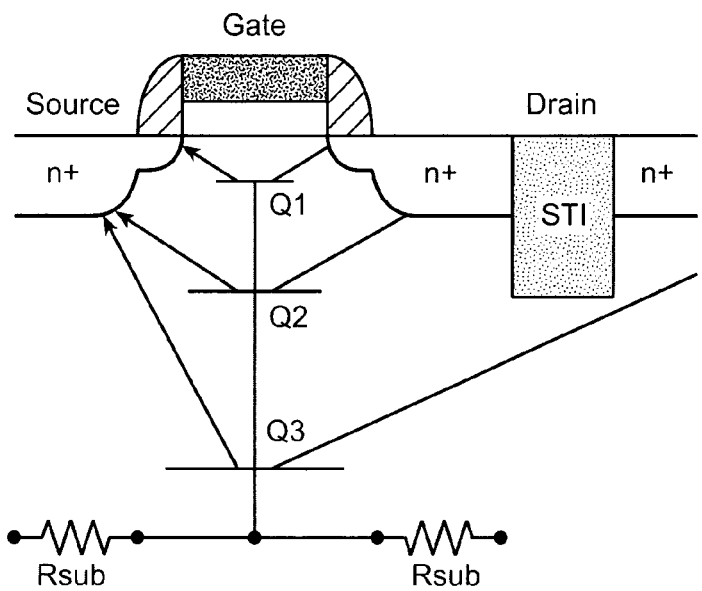
FIG. 5 is a cross-sectional view of the segmented drain STI region for three-bipolar NMOS fingers.

FIG. 4 is a cross-sectional view of the segmented drain diffusion region of a two-bipolar NMOS finger which has segmented drain diffusion, and FIG. 5 is a cross-sectional view of the segmented drain STI region for a three-bipolar NMOS finger which has segmented drain diffusion. In both Figures, Q1 represents the bipolar effect of LDD implantation, and Q2 represents the bipolar effect of drain junction underneath the channel including the segmented diffusion. In FIG. 5, Q3 represents the STI-bound bipolar transistor effect underneath the drain contacts. Due to the oxide overlap region between drain and gate, a high electric field is built up at this region in ESD events. This high electric field will induce avalanche breakdown of Q1, and thus trigger Q1. After Q1 is turned on, the ESD current flows on the silicon surface, i.e. the channel. Due to the ballasting resistance effect and the substrate coupling effect, Q2 will be turned on. Therefore, the ESD current will flow underneath the channel after Q2 is triggered. To achieve ESD robustness, it is expected to reduce the ESD current flowing into Q1 and turn-on all neighboring Q2's in NMOS fingers by the substrate coupling effect.

In conventional silicided NMOS fingers (see FIG. 1), because silicidation process is not very uniform and ballasting resistance is low, ESD current will be localized and higher ESD current will flow through Q1. Hence, higher joule heating results, and this can damage the LDD junction. In contrast, using the present invention, non-uniform silicidation process can be effectively controlled using the width (Wsb) of the self-ballasting resistors. The higher self-ballasting resistance will limit higher ESD current flowing into Q1. Although it is difficult to trigger Q3, Q3 is expected to be turned on in higher ESD current situations.

To optimize the self-ballasting resistance effect in silicided NMOS fingers which are in accordance with the present invention, silicided thick-oxide NMOS fingers for 2.5V and 3.3V in 0.13 um technology (Gflx) were studied. In this analysis, test structures of self-ballasting silicided NMOS drivers were designed in Gflx Cha4, TQV and AMTV test chips, and measured by transmission line pulse (TLP) generator. In these studies, Lcd was fixed at 2×mdr, where mdr is the minimum design rule, and Lsb is determined by the drain contact to gate spacing (DCGS), Lcd and Ldd. To avoid STI encroachment, Wsb was chosen as 1.5×mdr and 2×mdr in this study. As mentioned above, the segmented diffusion width ratio (k) in each finger is defined as $$\kappa \equiv \frac{N \times Wsb}{Wg}$$

where N is the number of segmented diffusion resistors in each NMOS finger, Wsb is the width of each segmented diffusion resistor (see FIG. 2), and Wg is the channel width (see FIG. 2). While k<1 for NMOS finger designs having segmented drain diffusion such as is shown in FIGS. 2-5 (preferably k<0.5 in order to limit the ESD current flowing on the silicon surface), k=1.0 for conventional silicided NMOS fingers, i.e., NMOS fingers without segmentation as shown in FIG. 1.

Figure 6:
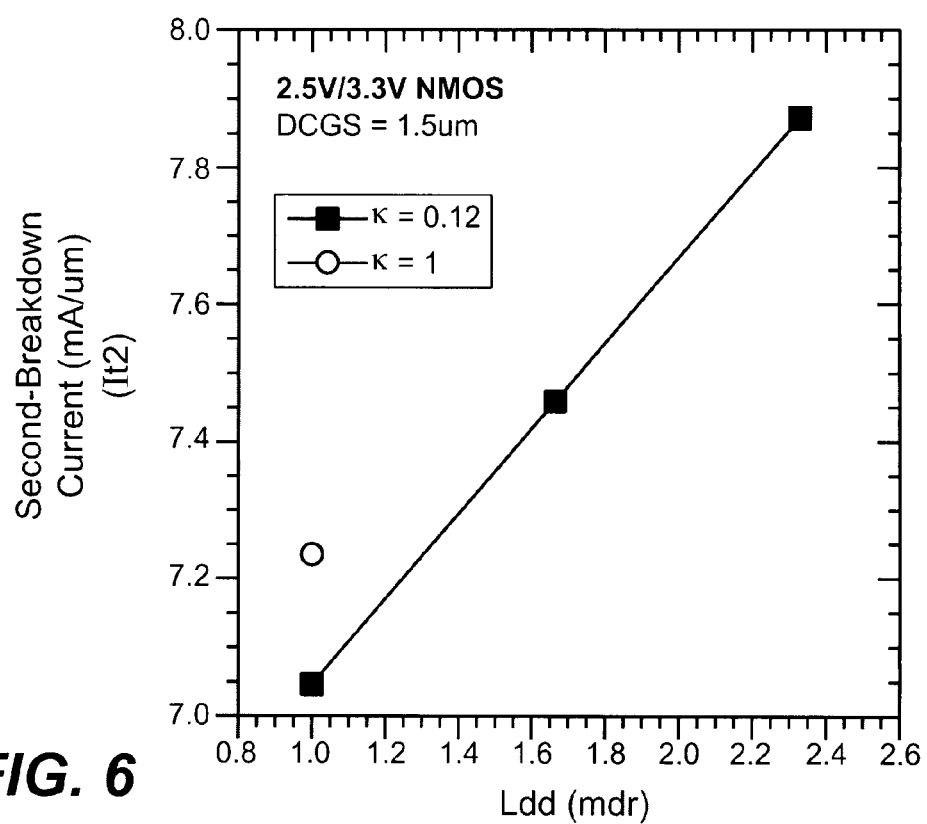
FIG. 6 is a graph depicting the relationship between the second breakdown current and the Ldd (drain diffusion overlap of the poly gate), both for NMOS fingers which are in accordance with an embodiment of the present invention (wherein $\kappa=0.12$) and for conventional NMOS fingers (wherein $\kappa=1$)

Determination of Ldd: FIG. 6 is a graph depicting the relationship between the second breakdown current, It2 (i.e., the breakdown current of the second transistor, Q2—see FIGS. 4 and 5) and the Ldd (drain diffusion overlap of the poly gate), both for NMOS fingers which have segmented drain diffusion (wherein κ=0.12 and DCGS=1.5 um) and for conventional NMOS fingers which have non-segmented drain diffusion (wherein κ=1). As clearly shown in FIG. 6, the second-breakdown current It2 of NMOS fingers having segmented drain diffusion linearly depends on Ldd. As also shown by FIG. 6, It2 would be improved (i.e., the breakdown current of Q2 would be higher), if the length of the overlap Ldd were provided as being greater than the minimum design rule. Preferably, Ldd is provided as being greater than or equal to 1.6×mdr, thereby providing a safe design.

Figure 7:
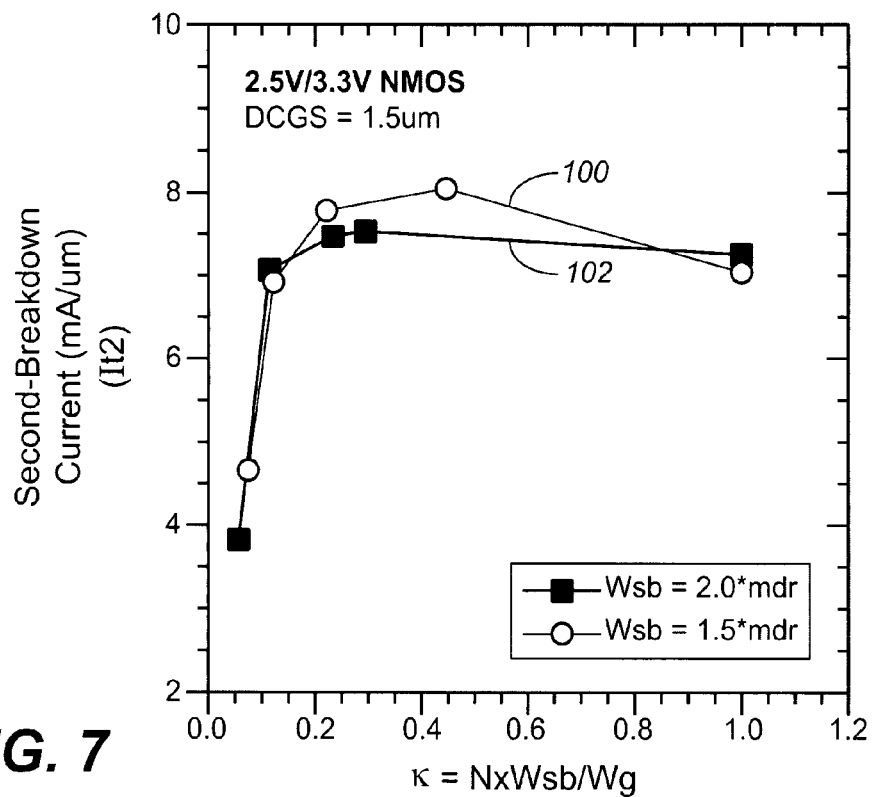
FIG. 7 is a graph depicting the dependence of second-breakdown current on the drain segmented diffusion width ratio ($\kappa$) of NMOS fingers with segmented drain diffusion.

Determination of the segmented diffusion width ratio (κ): As shown in FIG. 7, the second breakdown current, It2, is dependent on the segmented diffusion width ratio, κ. Line 100 illustrates the relationship between the second breakdown current, It2, and the segmented diffusion width ratio, κ, when the width of the drain diffusion segmented resistor, Wsb, equals 1.5×mdr and line 102 illustrates the same relationship when Wsb equals 2×mdr. As clearly shown in FIG. 7, optimization of self-ballasting resistance NMOS fingers is achieved when the segmented diffusion width ratio, κ, is between 0.2 and 0.45, i.e. the optimized segmented diffusion width is 20% to 45% of the channel width, Wg. In this range, the optimized values can provide ballasting resistance which is 2 to 5 times higher than the ballasting resistance of conventional layouts for a given DCGS. For design convenience, the segmented diffusion width ratio can be minimized.

Figure 8:
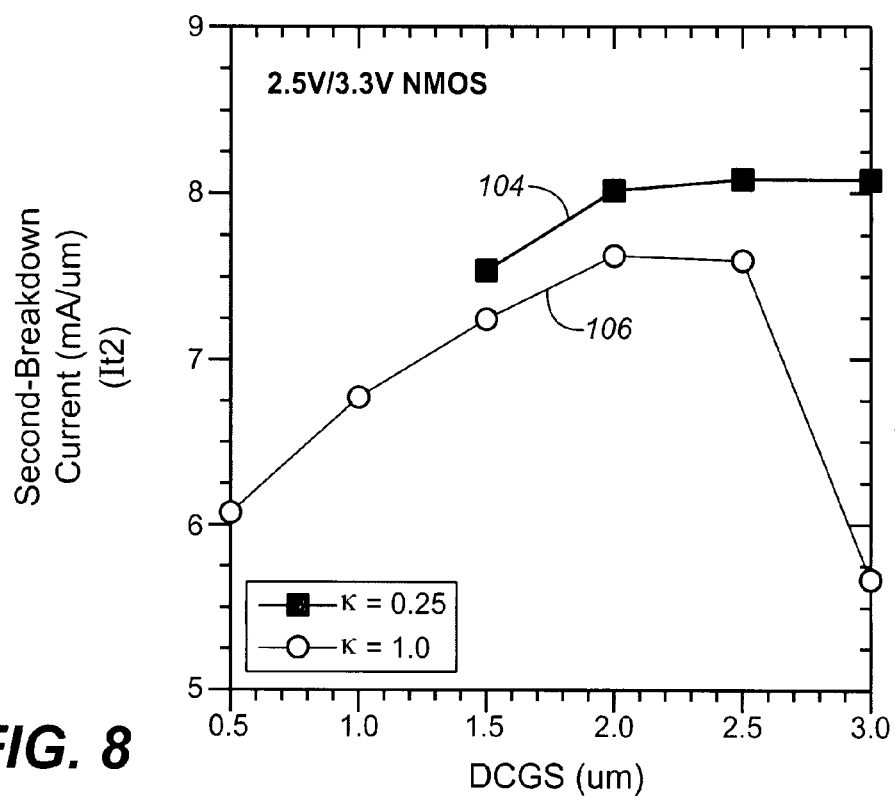
FIG. 8 is a graph depicting the dependence of second-breakdown current on drain-contact-to-gate spacing (DCGS) for $\kappa=0.25$ (i.e., NMOS fingers with segmented drain diffusion) and $\kappa=1.0$ (conventional NMOS fingers having non-segmented drain diffusion)

The dependence of the second breakdown current, It2, on drain contact to gate spacing, DCGS, is shown in FIG. 8 where Lsb=DCGS−Lcd−Ldd with Lcd=1.0×mdr and Ldd=2×mdr. Line 104 of FIG. 8 illustrates the relationship between drain contact to gate spacing, DCGS, and the second breakdown current when the segmented diffusion width ratio, κ, is 0.25. Line 106 represents the same relationship when the segmented diffusion width ratio, κ, is 1.0, i.e., for a conventional NMOS finger. As shown in FIG. 8, in the case of a conventional NMOS finger (i.e., where κ=1.0), the second breakdown current, It2, reaches the maximum value when DCGS is in the range of 2.0 um to 2.5 um which is believed to have the highest substrate coupling effect, and then rolls off when DCGS=3.0 um. In contrast, in the case where κ is 0.25, due to the high ballasting resistance effect of the segmented drain diffusion resistors, the second breakdown current It2 saturates to the maximum value but does not roll off. This validates the usefulness of the self-ballasting resistance layouts of the fingers for segmented drain diffusion designs where DCGS≧2.0 um.

Because the N+ diffusion resistor, i.e., the self-ballasting resistor, will saturate in high current operation, there is a minimum for the segmented diffusion width ratio as $$\kappa_{min} = It2(max)/I_{BR}$$

where It2 (max) is the maximum second-breakdown current density of NMOS fingers using traditional layouts (mA/um) and $I_{BR}$ is the breakdown current density of the N+ self-ballasting resistors. In this 0.13 um technology, the breakdown current density $I_{BR}$ is approximately 45 mA/um and the second breakdown current It2 is approximately 7.5 mA/um, therefore, κmin equals approximately 0.17, which is validated in FIG. 7.

Figures 9, 10:
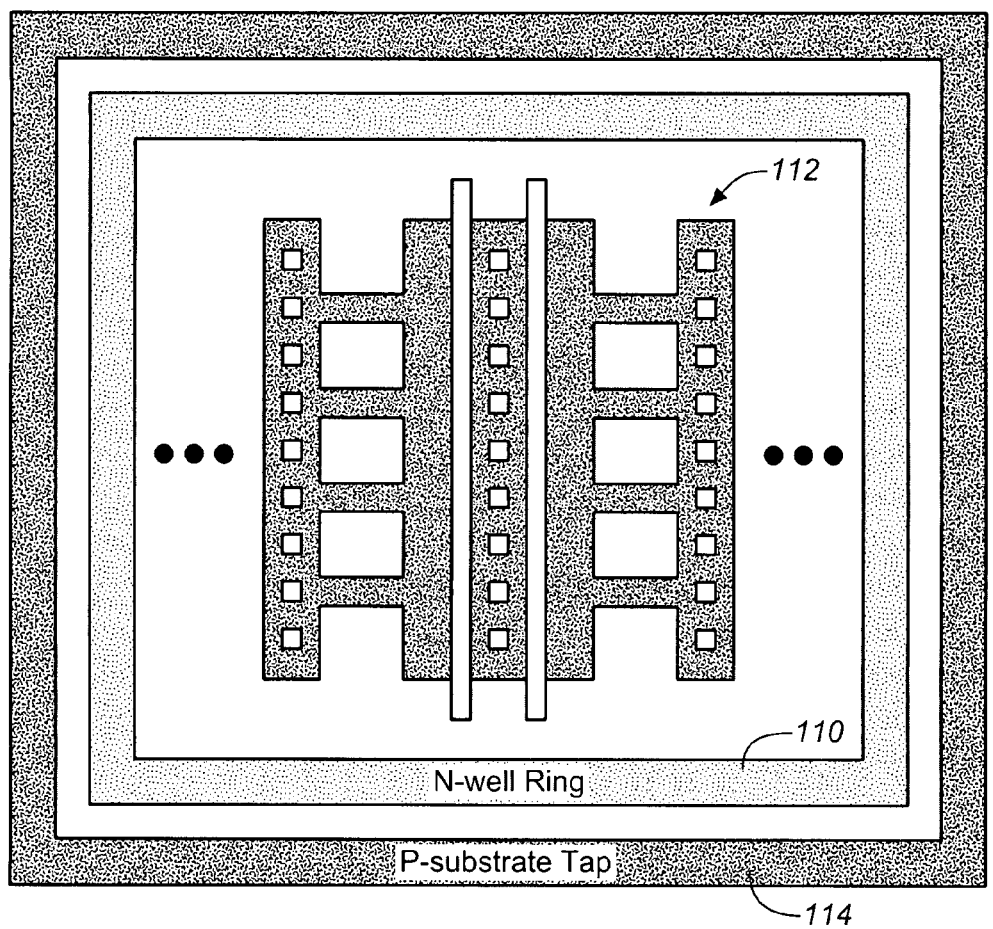
FIG. 9 is a top view of another embodiment of the present invention, which provides that self-ballasting resistance silicided NMOS fingers are surrounded by an N-well ring to enhance the substrate coupling effect.
FIG. 10 is a table which lists anticipated optimized parameters relating to NMOS fingers with a segmented drain diffusion design.

Enhancement of substrate coupling: The substrate coupling effect plays a very important role in silicided NMOS fingers. As shown in FIG. 9, substrate coupling enhancement can be achieved in connection with the present invention by using an N-well ring 110 surrounding the self-ballasting-resistance NMOS fingers 112 in bulk CMOS twin well process (reference numeral 114 identified a P-substrate tap). This approach increases substrate resistance underneath NMOS fingers.

TLP measurements were also done in 90 nm technology (G90). The data shows that It2 of 3.3V NMOS is 0 in the traditional layouts. It2 has been improved up to ~1 mA/um for DCGS=1.0 μm by using the present invention, which indicates that the self-ballasting resistance approach works in connection with G90 technology as well. However, the silicided NMOS fingers with this low It2 cannot be used as the ESD protection device. Preferably, test structures are designed and characterized in a G90 test chip where DCGS is from 1.5 μm to 3.0 μm. This can validate if It2 of silicided NMOS fingers can be improved by using this invention and thus same as that of non-silicided NMOS fingers in the future. Another limitation is the minimum DCGS is 1.5 um due to insertion of self-ballasting segmented resistors.

FIG. 10 is a table which lists anticipated optimized parameters relating to NMOS fingers with a segmented drain diffusion design, and should be interpreted in light of the foregoing discussion.

While preferred embodiments of the present invention are shown and described, it is envisioned that those skilled in the art may devise various modifications of the present invention without departing from the spirit and scope of the appended claims.

What is claimed is:

1. Silicided NMOS fingers comprising: gates; a source between the gates; drains; and at least one segmented drain diffusion proximate at least one of the drains, disposed generally between the at least one drain and at least one of the gates, wherein said segmented drain diffusion comprises a plurality of self-ballasting resistors, and wherein each of said drains includes drain contacts and wherein each self-ballasting resistor is aligned with a drain contact, wherein a segmented diffusion width ratio is defined as $$\kappa \equiv \frac{N \times Wsb}{Wg}$$

where N is the number of self-ballasting resistors in each NMOS finger, Wsb is the width of each self-ballasting resistor, Wg is a width of the gate, and wherein said self-ballasting resistors are sized and configured such that k<0.5.

2. Silicided NMOS fingers as recited in claim 1, wherein k is between 0.2 and 0.45.

3. Silicided NMOS fingers as recited in claim 1, wherein each of said drains includes drain contacts and wherein said drain contacts are separated by non-segmented diffusions.

4. Silicided NMOS fingers as recited in claim 1, wherein said source includes source contacts.

5. Silicided NMOS fingers as recited in claim 1, wherein said source includes source contacts, and wherein said source includes non-segmented source diffusion.

6. Silicided NMOS fingers as recited in claim 1, wherein said drain contacts are separated by non-segmented diffusions.

7. Silicided NMOS fingers as recited in claim 1, wherein there is a segmented drain diffusion proximate each of the drains, disposed generally between the drains and the gates.

8. Silicided NMOS fingers as recited in claim 7, wherein each segmented drain diffusion comprises a plurality of self-ballasting resistors.

9. Silicided NMOS fingers as recited in claim 8, further comprising spaces between said self-ballasting resistors.

* * * * *